(12) United States Patent
Williams

(10) Patent No.: US 7,631,230 B2
(45) Date of Patent: Dec. 8, 2009

(54) METHOD AND APPARATUS FOR TESTING A TRANSMISSION PATH

(75) Inventor: Emrys Williams, Eversholt (GB)

(73) Assignee: Sun Microsystems, Inc., Santa Clara, CA (US)

(*) Notice: Subject to any disclaimer, the term of this patent is extended or adjusted under 35 U.S.C. 154(b) by 1034 days.

(21) Appl. No.: 10/993,387

(22) Filed: Nov. 19, 2004

(65) Prior Publication Data

US 2006/0123289 A1 Jun. 8, 2006

(51) Int. Cl.
*G01R 31/28* (2006.01)
*G01R 31/04* (2006.01)

(52) U.S. Cl. .............................. 714/712; 324/538

(58) Field of Classification Search ............... 714/712, 714/724; 324/519, 538
See application file for complete search history.

(56) References Cited

U.S. PATENT DOCUMENTS

| | | | | |
|---|---|---|---|---|
| 6,104,198 | A * | 8/2000 | Brooks | 324/538 |
| 6,933,730 | B2 * | 8/2005 | Parker et al. | 324/538 |
| 6,998,849 | B2 * | 2/2006 | Tesdahl et al. | 324/519 |
| 7,109,728 | B2 * | 9/2006 | Crook et al. | 324/690 |
| 2004/0164755 | A1 | 8/2004 | Yamaoka et al. | |

FOREIGN PATENT DOCUMENTS

| | | |
|---|---|---|
| GB | 2143954 | 2/1985 |
| JP | 2001201753 | 7/2001 |

OTHER PUBLICATIONS

Combined Search and Examination Report under Sections 17 and 18(3), Application No. GB 0503641.3, Jul. 18, 2005, 6 pages.

* cited by examiner

*Primary Examiner*—James C Kerveros
(74) *Attorney, Agent, or Firm*—Robert C Kowert; Meyertons, Hood, Kivlin, Kowert & Goetzel, P.C.

(57) ABSTRACT

One embodiment of the invention provides apparatus and a method for testing a transmission path across one or more printed circuit boards. According to the method, a test signal is presented at a first location on the transmission path. The test signal is generally low frequency compared to normal data communications on the transmission path. A pickup line is capacitively coupled at a second location to the transmission path. The pickup line is monitored with a detector to see whether or not the test signal is present. If the test signal is not present, it is determined that there is a fault on the transmission path between the first location and the second location.

32 Claims, 6 Drawing Sheets

METHOD AND APPARATUS FOR TESTING A TRANSMISSION PATH

FIELD OF THE INVENTION

The present invention relates to testing a transmission path, and especially to testing a transmission path on a printed circuit board.

BACKGROUND OF THE INVENTION

FIG. 1 illustrates signal communication apparatus 100 for sending a signal from a transmitter 121 across to a receiver 122. Apparatus 100 might be included in a computer or other such electronic equipment. The transmitter 121 is located in a first field replaceable unit (FRU) 111, while the receiver 122 is located in a second FRU 112. Each FRU typically comprises a printed circuit board (PCB). FRU1 111 and FRU2 112 are joined by connector C1 11 on FRU1 111 and connector C2 12 on FRU2 112. The transmitter 121 is attached by solder ball 121A to line 1 101, which in turn is linked to connector C1 11 by solder ball 11A. Receiver 122 is linked by solder ball 122A to line 2 102, which in turn is linked to connector C2 12 by solder ball 12A. Accordingly, a signal from transmitter 121 passes via solder ball 121A, line1 101, solder ball 11A, connectors C1 11 and C2 12, solder ball 12A, line2 102, and then solder ball 122A before arriving at receiver 122. This route from transmitter 121 to receiver 122 will be referred to as transmission path 110.

A fault may occur in apparatus 100, and this can lead to a signal from transmitter 121 failing to arrive at receiver 122. Although such a fault could develop anywhere along the transmission path 110, for example due to a crack in a PCB trace corresponding to line1 101 or line2 102, in practice the most probable location of such a fault is in one of the solder balls 121A, 11A, 12A, 122A, or at the connection between connector C1 11 and connector C2 12.

A short circuit fault anywhere along the transmission path 110 may cause the signal to be absent along the whole of path 110. An open circuit fault anywhere along the transmission path 110 causes the signal to be absent between the fault and the receiver. Practical experience has shown that most faults on PCB transmission paths and connectors are open circuits.

In a situation where transmitter 121, receiver 122, and the whole of transmission path 110 are all located on a single FRU, then the service strategy should a communication fault be detected is relatively straightforward. It is known that the fault lies in the FRU containing both the transmitter and the receiver, and accordingly a service engineer can replace this FRU with a properly functioning counterpart.

However, for the configuration shown in FIG. 1, it is difficult to know whether a fault has arisen in FRU1 111 or in FRU2 112. One possibility of course is to replace both FRU1 111 and also FRU2 112, but this is expensive, since it involves replacing one FRU that is presumably still fully functional. Alternatively a service engineer may try to replace first FRU1 111 and then, if this does not rectify the fault, replace FRU2 112 (as well as potentially re-installing the original, presumably non-faulty, FRU1 111). However, this requires the service engineer to have both FRU1 and FRU2 available. In addition, the service strategy is more time-consuming than replacement of a single FRU, and may require two or more interruptions of normal machine operations to complete the repair. These problems are exacerbated if the transmission path 110 extends across more than two FRUs.

It is therefore desirable to be able to investigate transmission path 110 in more detail to try to locate a fault to a particular FRU (e.g. one of FRU1 or FRU2), thereby allowing the repair to be performed with the replacement of just a single FRU. It is especially helpful if the location of a fault to a single FRU can be performed automatically, so that a service engineer only needs to be provided with a replacement for the particular FRU known to be faulty, rather having to be provided with potential replacements for both (all) of the FRUs involved in the transmission path.

Nevertheless, the ability to locate a fault to a particular region within a single FRU can also be of benefit. For example, a FRU may contain multiple automatic system reconfiguration units (ASRUs), which can be deconfigured on an individual basis pending replacement of the complete FRU. Accordingly, the determination of the location of a fault within a FRU may help a system to decide which particular ASRU(s) to deconfigure in response to the fault, for example to ensure that the fault is not exercised pending replacement of the entire FRU.

One possible approach to locating a fault on a PCB interconnect such as shown in FIG. 1 is to add a trace that branches from line1 101 to a first detector, and likewise a trace that branches from line2 102 to a second detector. These extra traces could be used to monitor the signals on line1 101 and line2 102, and hence to try to locate any fault within transmission path 110. However, this approach suffers from the problem that the extra traces may adversely impact the transmission line characteristics of line1 101 and line2 102. Moreover, it may be hard to accommodate the extra traces within the PCB layout of the relevant FRU. It is especially difficult to accommodate such extra traces within an existing circuit design.

U.S. Pat. No. 6,714,021 describes an alternative approach based on time domain reflectometry for locating a fault on a PCB interconnect. This approach involves transmitting a signal of known shape along a transmission wire and looking at any reflections that are generated as a result of the transmission due a mismatch in impedance. Thus, in a typical circuit, such as shown in FIG. 1, there may be a reflection from various locations, such as from the interface between line1 101 and connector C1 11, from the junction between connector C1 11 and connector C2 12, and from the termination of line2 112 at the receiver 122. These reflections from the different locations will be separated in time, based on the signal propagation time from the transmitter 121 to the point of reflection and back again.

Any circuit fault in transmission path 110 will generally alter the pattern of reflected signals. For example, a fault is likely to introduce its own signal reflection, while at the same time it will generally suppress reflections from locations beyond the fault. Accordingly, an analysis of signal reflections received back at transmitter 121 from transmission path 110 can help to determine the presence and location of any fault in the transmission path 110.

One drawback with time domain reflectometry is the need for appropriate circuitry to be incorporated into transmitter 121 to generate the test signal and to analyse the reflected signal. This will tend to increase the cost and complexity of the design, especially as PCBs become more and more complicated, with potentially multiple transmitters on a single FRU.

SUMMARY OF THE INVENTION

Accordingly, one embodiment of the invention provides a method for testing a transmission path across one or more printed circuit boards. The method comprises presenting a test signal at a first location on the transmission path. The test signal is generally low frequency compared to normal signal communications on the transmission path. The method further comprises providing a pickup line capacitively coupled at a second location to the transmission path, and monitoring the pickup line with a detector to see whether or not the test signal is present. If the test signal is not present, it is determined that there is a fault on the transmission path between the first location and the second location.

Such an approach is non-invasive for the transmission path itself, and can be implemented at relatively low cost, even to existing circuit designs. Moreover, the testing can be performed in a noisy environment, for example if the majority of the printed circuit boards are still performing their normal operations. The approach is primarily targeted at the detection of open circuit faults, since such an open circuit fault prevents a signal from passing beyond the fault to the receiver.

In one particular embodiment, the first location on the transmission path represents the output pin of a semiconductor device, and the test signal is presented at the output pin using a JTAG interface of the semiconductor device. Many existing semiconductor devices already support a JTAG interface, and so this approach can be easily implemented.

In one particular embodiment, the test signal comprises a periodic signal such as a square wave having a substantially lower frequency than signals communicated over the transmission path during normal operation of the printed circuit boards. This allows the test signal to be more easily distinguished from noise signals arising from normal operation of the printed circuit boards. For example, the detector may include a phase sensitive detector and low pass filter to discriminate the test signal from noise.

In one particular embodiment, a calibration is performed on the transmission path, such as at manufacture, and information from this calibration may then be stored into the printed circuit board, for example in a programmable read only memory. This information allows the detector to compare the monitored test signal against the calibrated signal, in order to determine whether there has been any change (which would imply that a fault has occurred).

In one particular embodiment, the pickup line is capacitively coupled to multiple transmission paths. This reduces the overhead of the test facility compared to the functional components of the board, given that a single pickup line can be shared for testing across multiple transmission paths.

In one particular embodiment, two or more pickup lines are capacitively coupled at respective locations to a transmission path. Each of the pickup lines is monitored to see whether or not the test signal is present on the respective pickup line. If the test signal is not present on a pickup line, this indicates that there is a fault on the transmission path between the first location and the location where the pickup line is capacitively coupled to the transmission path. The use of multiple pickup lines therefore allows the position of any fault on the transmission line to be determined more accurately. It is especially helpful for service procedures if the position of any fault can be located to a single field replaceable unit.

Another embodiment of the invention provides apparatus for testing a transmission path across one or more printed circuit boards. The apparatus comprises a facility for inserting a test signal at a first location on the transmission path. The test signal is generally low frequency compared to normal signals on the transmission path. The apparatus further comprises a pickup line capacitively coupled at a second location to the transmission path and a detector for monitoring the pickup line to see whether or not the test signal is present. If the test signal is not present, it is determined that there is a fault on the transmission path between the first location and the second location.

It will be appreciated that the apparatus embodiments of the invention will generally benefit from the same particular features as the method embodiments of the invention described herein.

BRIEF DESCRIPTION OF THE DRAWINGS

Various embodiments of the invention will now be described in detail by way of example only with reference to the following drawings in which like reference numerals pertain to like elements and in which.

DETAILED DESCRIPTION

Figure 1:
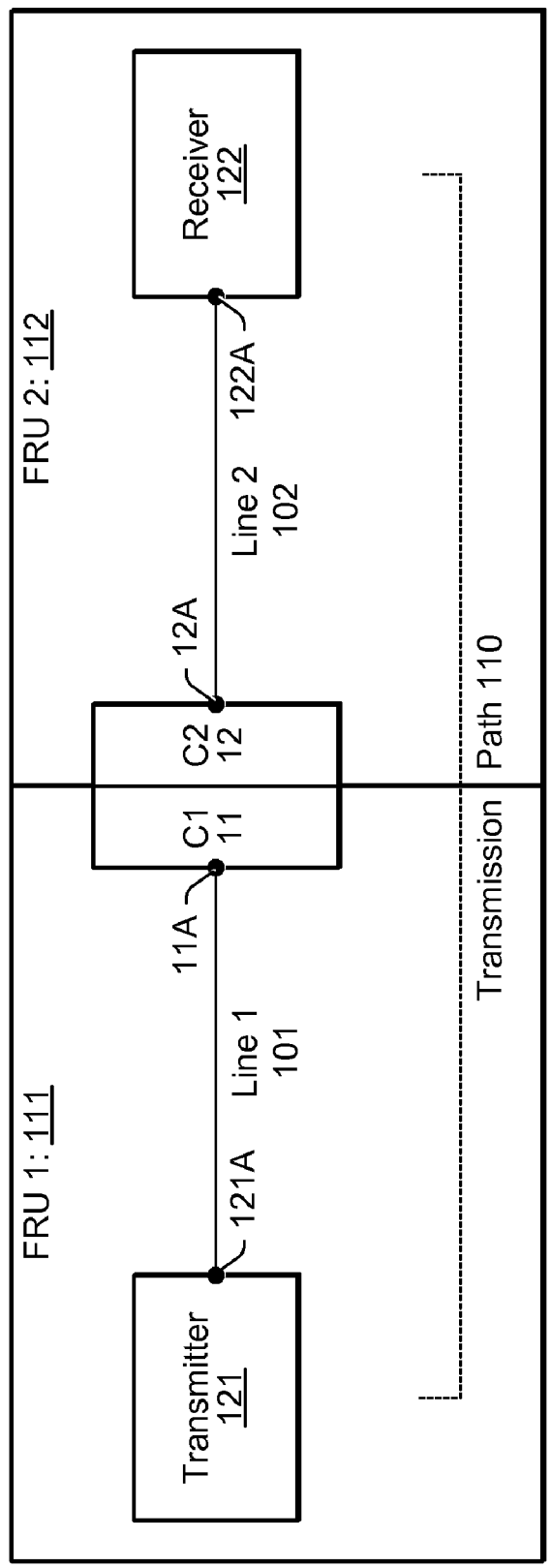
FIG. 1 illustrates a transmission path split across two field replaceable units (FRUs)
Figure 2:
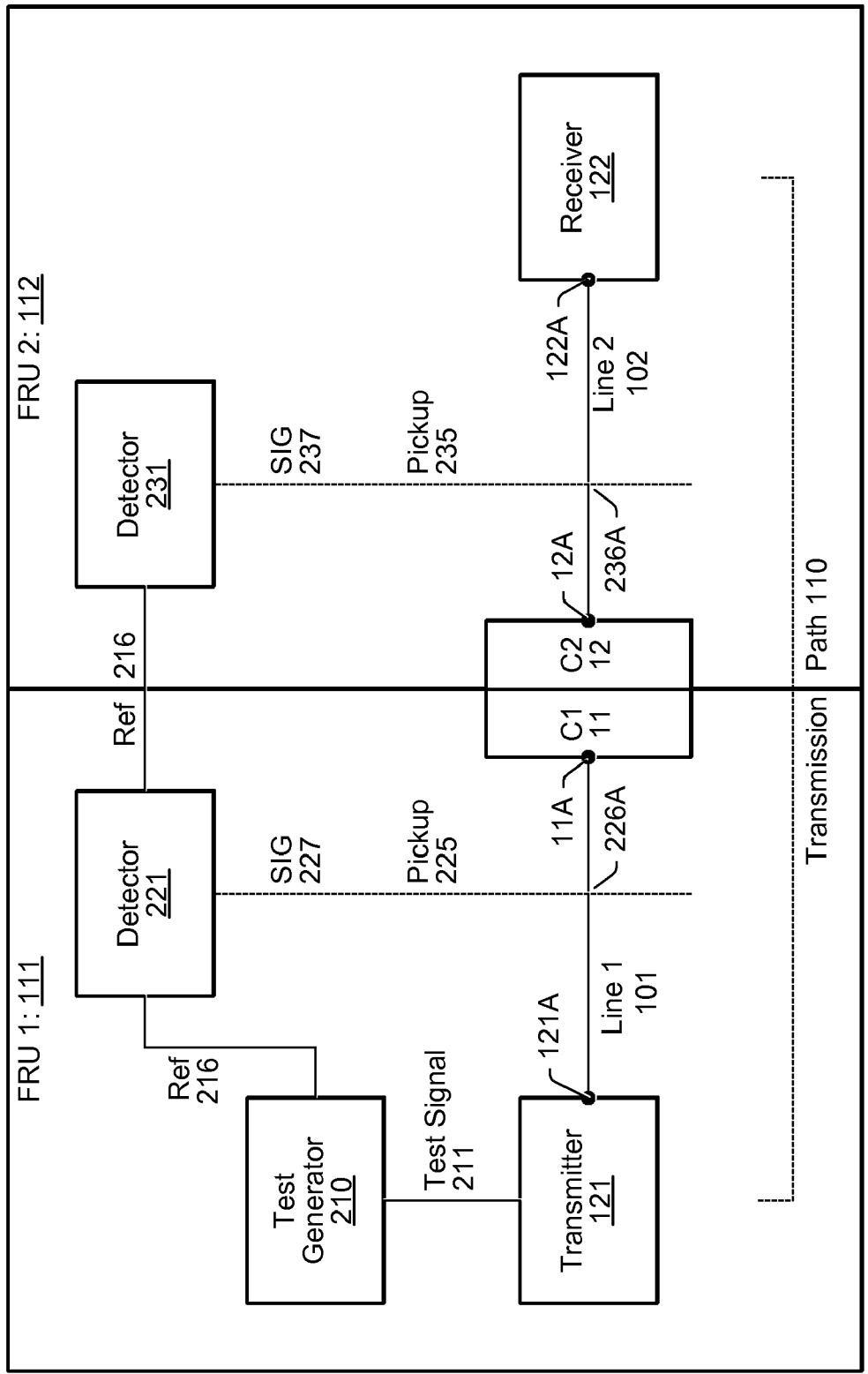
FIG. 2 illustrates a signal communications line such as shown in FIG. 1, provided with a test facility in accordance with one embodiment of the invention.

FIG. 2 illustrates apparatus 200 in accordance with one embodiment of the invention. Apparatus 200 includes the same transmission path 110 as apparatus 100 from FIG. 1, but with the addition of certain detection capabilities to monitor the presence of a signal on the transmission path 110. Note that since the components within transmission path 110 are the same as described above in relation to FIG. 1, they will not be described again with reference to FIG. 2. Indeed, one of the benefits of the approach described herein is that the detection capability can be added (retro-fitted) to existing circuit designs.

As shown in FIG. 2, a test generator 210 is provided, which feeds a test signal 211 to transmitter 121. The transmitter in turn passes the test signal 211 onto line1 101, and from there it travels along the rest of transmission path 110, unless there is a fault in the transmission path 110. The test generator also produces a reference signal 216, which is described in more detail below.

In one embodiment, test generator 210 uses a JTAG interface to supply the test signal 211 to transmitter 121. Such a JTAG interface conforms to a well-known standard for testing semiconductor devices, known formally as the IEEE 1149.1 standard test access port and boundary scan. The JTAG interface is described for example in the White Paper "Introduction to the JTAG Boundary Scan", available at http://www.sun.com/microelectronics/whitepapers/wpr-0018-01.

The JTAG interface allows a predetermined signal to be supplied for transmission from the output port of a chip. Accordingly, test generator 210 can use the JTAG interface to cause transmitter 121 to output a desired signal 211 over transmission path 110. It will be appreciated that many semiconductor circuits (chips) already support JTAG functionality for general testing purposes, and so test generator 210 can exploit this interface without requiring any additional support or overhead within transmitter 121.

Dependent upon the particular implementation of JTAG support within transmitter 121, it may not be possible to use the JTAG interface to produce a controlled output from transmitter 121 simultaneously with normal operations of transmitter 121. In other words, other operations (e.g. on other output lines) of transmitter 121 may have to be temporally suspended while the test signal 211 from test generator 210 is being sent out over transmission path 110. Other chip implementations however may allow at least limited continued processing of the transmitter 121 while the JTAG interface is being exercised. For example, transmitter 121 may allow test generator 210 to use its JTAG interface to place a test signal on the output port for line1 101 at the same time as the transmitter is continuing with normal communications on other data ports.

A skilled person will be aware of various other possible designs to inject a test signal 211 onto transmission path 110. For example, test generator 210 may be located off FRU1 111, such as in a service processor for a system, but with some link provided to transmitter 121. Alternatively the test generator 210 may be incorporated into transmitter 121 itself (in other words, the transmitter 121 may have inherent support for outputting a suitable test signal onto line1 101). In addition, in other embodiments, the interface between test generator 210 and transmitter 121 may not conform to the JTAG standard, but may conform to some other protocol instead. For example, transmitter 121 may be provided with a test pin, which when asserted allows an input signal to be presented at a specified output port. Another possibility is that the test signal 211 is created by supplying transmitter 121 with a message to transmit, where the message itself corresponds to the test signal. Note that in this latter case, the transmitter 121 may not be specifically aware that any testing is being performed, but rather transmits the message (representing the test signal) in normal fashion over transmission path 110.

As shown in FIG. 2, apparatus 200 is further provided with a first pickup line 225 that crosses line1 101, and a second pickup line 235 that crosses line2 102. The first pickup line 225 is connected to a first detector 221, while the second pickup line 235 is connected to a second detector 231. Accordingly, detector 221 can be used to monitor for the presence of a signal 227 on pickup line 225, and detector 231 can be used to monitor for the presence of a signal 237 on pickup line 235. It will be appreciated that the first and second detectors 221, 231 may be implemented as a single device if appropriate (especially if the transmission path 110 is located on a single FRU).

Pickup line 225 is shown in FIG. 2 as crossing PCB line1 101 at location 226A. Pickup line 225 is in a different board plane from line1 101, and hence there is no direct linkage or connection between the two. Nevertheless, some capacitive coupling will exist between line1 101 and pickup line 225 at location 226A. As a result, any signal present on line1 101 should appear (albeit weakly) on pickup line 225. Likewise, there is no direct contact between line2 102 and pickup line 235 where they cross one another at location 236A. However, there is capacitive coupling between line2 102 and pickup line 235 at location 236A, and so any signal present on line2 102 should appear (again weakly) on pickup line 235.

If we consider a test signal sent from transmitter 121 and intended for receiver 122, then if this signal is found on the pickup line 225 by detector 221, it implies that transmission path 110 is functional at least between transmitter 121 and location 226A, where pick up line 225 is capacitively coupled to the transmission path 110. Similarly, if the signal from transmitter 121 is found by detector 231, then this implies that the transmission path 110 from transmitter 121 is functional at least from transmitter 121 through to location 236A.

Accordingly, the presence or absence of the test signal 211 from test generator 210 at detector 221 and/or detector 231 provides useful information about the location of any possible fault in transmission path 110. For example if the test signal 211 from transmitter 121 is not found on pickup line 225, then this implies an error or fault in the portion of the transmission path 110 between transmitter 121 and location 226A. The most likely cause of such a fault is a problem with solder ball 121A, but in any event, it is known that the problem must be located within FRU1 111. Conversely, if the signal 211 from transmitter 121 is detected both at detector 221 and also at detector 231, then it is known that the transmission path 110 from transmitter 121 through to at least location 236A is properly functional. This then implies that any fault in the transmission path 110 must be located between location 236A and receiver 122 (assuming that receiver 122 is not receiving the correct signal). This suggests that there may be a problem at solder ball 122A, but in any event it is known that the problem lies within FRU2 112.

If the test signal 211 is found at detector 221 but not at detector 231, then it can be deduced that the problem in transmission path 110 occurs between location 226A and location 236A. In these circumstances, the fault can not be localised to an individual FRU, since it may be solder ball 11A or solder ball 12A that is faulty (or any other component in this portion of transmission path 110). Nevertheless, it may still be helpful to know that there is no fault either in transmitter 121 or in the portion of line1 101 that extends through to location 226A (perhaps because a signal from here is also being fed off to some other component, not shown in FIG. 2).

In accordance with one embodiment of the invention, the test signal 211 comprises a square wave of relatively low frequency compared to the normal data rates in the system. For example, in one implementation the test signal might have a frequency of approximately 10 kHz, but higher or lower frequencies could be used instead, such as 1 kHz, 100 kHz, and so on. The use of a low frequency signal has the advantage that it is relatively straightforward to generate in hardware or software, and can be easily accommodated, for example via a JTAG interface. In addition, most of the noise on pickup line 225 or 235 will tend to be of relatively high frequency, for example due to other data transmissions and operations either on the same PCB as pickup line 225, or possibly on another PCB that is physically close to it. Accordingly, the use of a comparatively low frequency for the test signal 211 allows the capacitively coupled signal 227 on pickup line 225 (or signal 237 on line 235) to be discriminated more readily from such noise. The use of a relatively low frequency for test signal 211 also allows phase coherency of the signal to be maintained across the PCB, which can assist with detection, as described in more detail below.

Figure 3:
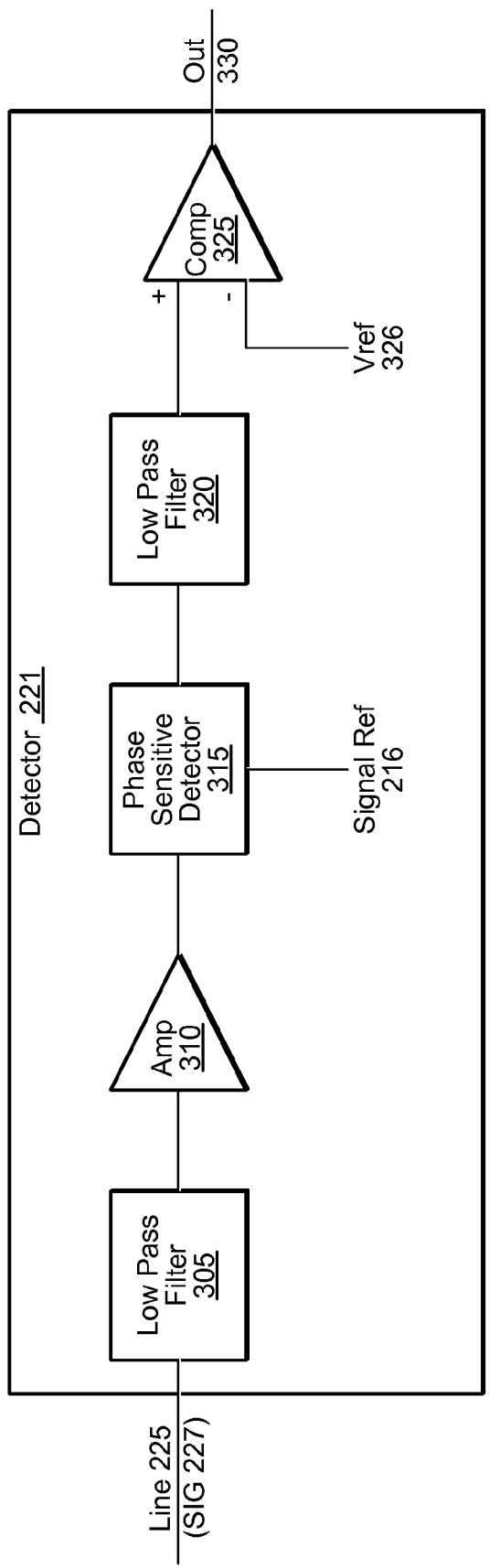
FIG. 3 illustrates in more detail the detector from the test facility of FIG. 2, in accordance with one embodiment of the invention.

FIG. 3 is a schematic diagram of detector 221 in accordance with one embodiment of the invention. It will be appreciated that detector 231 may also be constructed in an analogous fashion. Detector 221 has an input line 225 representing the pickup trace that is capacitively coupled to the transmission path 110 at location 226A. The detector has to determine whether a signal 227, corresponding to test signal 211, is or is not present on line 225.

Line 225 is connected first to a low pass filter 305 to remove much of the general noise that pickup line 225 receives from normal operations of PCB 111. As mentioned above, it is assumed that the test signal 211 from test generator 210 has a lower frequency than general data operations on PCB 111, and hence the noise from the latter can be largely eliminated by a suitable low pass filter 305. In other words, low pass filter 305 is chosen with an appropriate cut-off frequency to allow through frequencies corresponding to test signal 211, but to reject higher frequency noise.

The signal from low pass filter 305 is then fed through a high input impedance amplifier 310. In one embodiment, the gain of amplifier 310 is of the order of 1000, but the gain can be modified according to the circumstances of any particular detector.

The amplified signal is then passed into a phase sensitive detector 315, which also receives a reference signal 216 from the test generator 210. This reference signal 216 shares the periodicity and phase of the test signal 211 (and may in fact represent a copy of it). Note that maintaining phase matching of the test signal 211 and the reference signal 216 is made easier by the relatively low frequencies involved.

The phase sensitive detector 315 looks for a signal 227 on line 225 that shares the same phase and frequency as the reference signal 216, and outputs a signal which in general terms corresponds to the degree of matching between the input signal 227 and the reference signal 216. In particular, the output from the phase sensitive detector 315 is a maximum when the signal on line 225 corresponds exactly to the reference signal 216. Alternatively, if there is no signal on line 225, or simply noise or some other signal unrelated to the reference signal 216, then on average the output from the phase sensitive detector 315 is zero. The output from the phase sensitive detector 315 is at its most negative if the signal on line 225 is inversely correlated with the reference signal 216.

The output from the phase sensitive detector 315 is passed through another low pass filter 320, which averages the output from the phase sensitive detector 315 over multiple periods of the reference signal 216. For example, if the test signal 211 has a frequency of 10 kHz, then the low pass filter 320 may have a cut-off frequency of 0.1 Hz. Accordingly, if the signal 227 on line 225 represents noise or is otherwise unrelated to the reference signal 216, then over multiple cycles of the reference signal 216, the output from the phase sensitive detector 315 will average to zero, and hence the output from the low pass filter 320 will likewise be zero. However, if there is a close correlation between the signal 227 on line 225 and the reference signal 216, then the low pass field will output a steady (positive) voltage indicative of this high level of correlation.

The output from the low pass filter 320 is passed into comparator 325, which compares the output against a voltage reference signal 326 (Vref). If the output from the low pass filter 320 is above the voltage reference 326, then it is determined that a signal 227 derived from test signal 211 has been detected on line 225. On the other hand, if the signal from low pass filter 320 is below the voltage reference 326, then it is assumed that there is no correlation (or an inverse correlation), and hence test signal 211 is not visible on line 225.

In this manner, detector 221 produces a binary output 330 which serves to indicate the presence or absence of a signal 227 on line 225 that corresponds to the test signal 211 from test generator 210. If such a signal 227 is indeed detected, then this implies that the test signal 211 is present at location 226A, where the pickup line 225 is capacitively coupled to transmission path 110. Conversely, if no such signal 227 is detected, then this implies that test signal 211 is not present at location 226A, and so there is some fault on the transmission path 110 prior to location 226A.

Note that in some cases a fault on transmission path 110 may not completely prevent test signal 211 from propagating, but may greatly attenuate the signal, perhaps to a level that is too weak for proper detection by receiver 122. Such a reduced level of test signal 211 will produce a reduced level of capacitively coupled signal 227 on pickup line 225, which in turn will lead to a lower level output from phase sensitive detector 315. The voltage reference 326 can be set to discriminate against such a weaker signal 227 if appropriate.

An appropriate setting for the voltage reference signal 326 can be determined by calibrating detector 221. Such calibration is useful, because in general the degree of capacitive coupling between pickup line 225 and trace 101 is not well-defined (although it can be estimated from the design of PCB 111). Such calibration may be performed during testing of the PCB at manufacture. One possible approach is to applied a predetermined signal to line 101, and to use detector 221 to measure the resulting voltage on pickup line 225. Assuming that line 101 and 102 are properly operational, which can be confirmed by verifying that the input to receiver 122 matches the output from transmitter 121 or by any other suitable technique (potentially involving external test apparatus), this then represents the signal level expected at detector 221 for a properly functioning device.

In one particular embodiment, a variable digital voltage source (not shown in FIG. 3) may be used to provide Vref 326, where the output of the digital voltage source is fed through a digital-to-analog converter into detector 221. During calibration, the value of Vref 326 from the voltage source can be stepped to find the value of Vref 326 that matches the output from low pass filter 320—i.e. the value of Vref 326 that just causes the output from comparator 325 to flip. This value for Vref 326 then represents the expected voltage level from low pass filter 320 absent any fault, and can be stored as a calibration setting, for example in some EEPROM on the FRU (such as the EEPROM which is used for storing the FRU ID). During subsequent operations, the value of Vref 326 can be matched to this calibration setting, less an appropriate margin to allow for natural signal variability and so on. Any output from low pass filter 320 below this value of Vref 326 then indicates that the apparatus is no longer in its original state, and so presumably reflects the presence of a fault somewhere in apparatus 200.

In an alternative embodiment, detector 221 may include a digital voltmeter rather than comparator 325, with an analog-to-digital converter interposed between the output of low pass filter 320 and the digital voltmeter. In this embodiment, the voltage output from the low pass filter 320 can be measured with the digital voltmeter during manufacturing for calibration purposes, and this measured value stored within FRU 111. In any subsequent testing, a comparison can be made (whether in hardware or software) between the calibrated voltmeter reading and the new voltmeter reading, and if the latter is found to be less than the former by more than some predetermined margin, this would again indicate the presence of a fault in apparatus 200.

Figure 4:
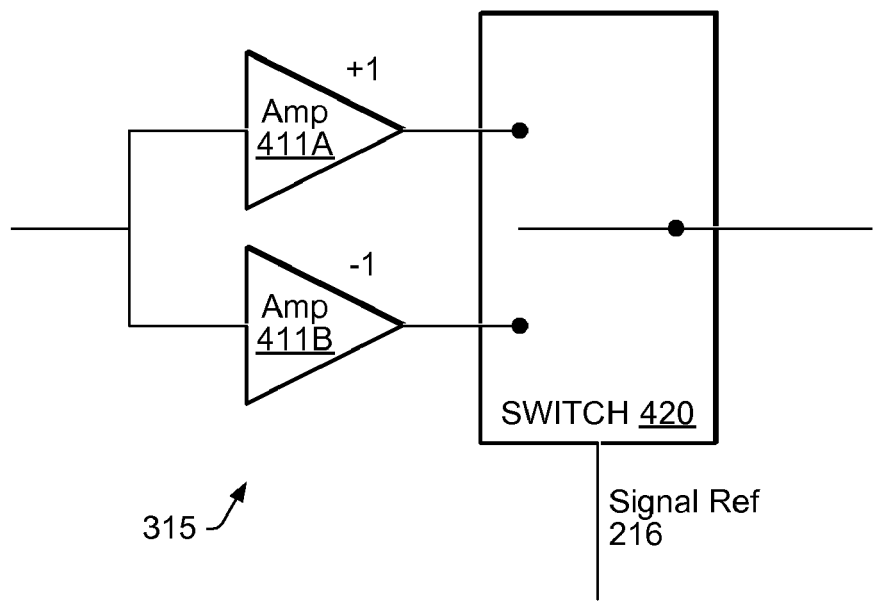
FIG. 4 illustrates in more detail the phase sensitive detector from the detector of FIG. 3, in accordance with one embodiment of the invention.

FIG. 4 illustrates phase sensitive detector 315 in more detail in accordance with one embodiment of the invention. The input of the detector is linked to two amplifiers 411A, 411B. These two amplifiers have the same gain as each other, except that one amplifier 411A has a positive gain and the other amplifier 411B has a negative gain. For example, in FIG. 4 the gain of amplifier 411A is indicated as +1 and the gain of amplifier 411B is indicated as −1, but other (equal and opposite) gains could be used if appropriate. The phase sensitive detector 315 also includes a switch 420 which is operated under the control of the reference signal 216. The output from the phase sensitive detector 315 is controlled by switch 420, and is taken from amplifier 411A if the switch is set to position A and from amplifier 411B if the switch is set to position B.

In operation, it is assumed that both the signal 227 to be detected (and provided as input to the two amplifiers 411A and 411B) and also the reference signal 216 used to control switch 420 are square waves having the same frequency and phase. It is also assumed for ease of discussion that these square waves go between +1 and −1, and that when the reference signal 216 has the value +1 the switch 420 is set to position A, and that when the reference signal 216 has the value −1 the switch is set to position B.

Accordingly, for the positive half of the test signal square wave cycle, the switch 420 is set to position A. The output is therefore taken from amplifier 411A, which applies a gain of +1 to a signal of +1 to give an output of (+1)×(+1)=+1. Conversely, for the negative half of the test signal square wave cycle, the switch 420 is set to position B. In this case, the output is taken from amplifier 411B, which applies a gain of −1 to a signal of −1 to give an output of (−1)×(−1)=+1. In other words, when the input to the phase sensitive detector 315 is matched in frequency and phase to reference signal 216, the output from the phase sensitive detector is a constant positive voltage across all phases.

In contrast if we assume that the input to the phase sensitive detector 315 is a constant signal of say +1, then the output from phase sensitive detector 315 is a signal that oscillates between +1 and −1 at the frequency of the reference signal 216. It will be appreciated that such an output would be rejected by low pass filter 320, as discussed above in reference to FIG. 3. In addition, if the input signal into the phase sensitive detector 315 represents general noise, there will be no correlation with the reference signal 216. The output from the phase sensitive detector 315 will therefore average to zero over multiple cycles of the reference signal 216. Accordingly, phase sensitive detector 315 can provide a very high level of discrimination for a signal that is matched in phase and frequency to the test signal 211, and so can detect whether or not such a signal is present on pickup line 225 even in the presence of considerable noise.

Figure 5:
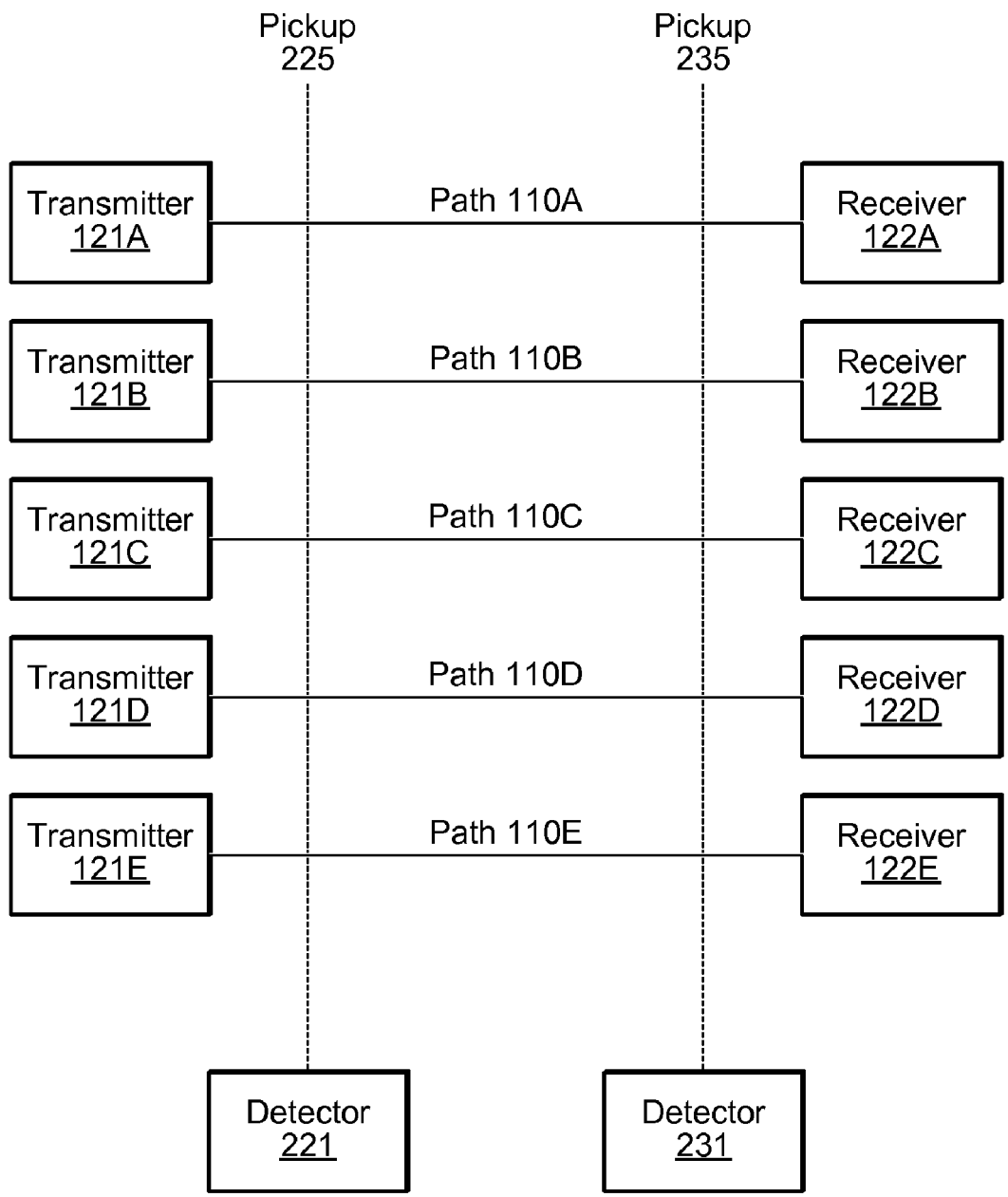
FIG. 5 illustrates the provision of a test facility for multiple transmission paths in accordance with one embodiment of the invention.

In the embodiment of FIG. 2, pickup lines 225 and 235 each extend across only a single transmission path 110. However, a single pickup line may be coupled to multiple transmission paths. This situation is illustrated in FIG. 5, which depicts multiple transmission paths, namely path 110A between transmitter 121A and receiver 122A, path 110B between transmitter 121B and receiver 122B, path 110C between transmitter 121C and receiver 122C, path 110D between transmitter 121D and receiver 122D, and path 110E between transmitter 121E and receiver 122E. Note that the different transmission paths may or may not be in the same plane as one another, but all are capacitively (rather than directly) coupled to the pickup lines 225 and 235.

Assuming that a test signal 211 is only inserted onto one transmission path 110 at a time, then this test signal will be coupled onto pickup trace 225 and presented to detector 221 as previously described (likewise for pickup line 235 and detector 231). The ability to share a single pickup line 235 and a single detector 231 across multiple transmission paths 110A, 110B, 110C, 110D, 110E significantly reduces the implementation overheads of the approach described herein, in terms of component cost, space requirements, and so on.

It will be appreciated that the transmitters 121, transmission paths 110, and receivers 122 shown in FIG. 5 may be distributed across multiple PCBs. For example, transmitters 121A, 121B, 121C, 121D, and 121E may or may not be on the same PCB as one another, and likewise receivers 122A, 122B, 122C, 122D and 122E may or may not be on the same PCB as one another. In addition, the transmitter for any given transmission path may or may not be on the same PCB as a given pickup line for that transmission path, and similarly the receiver for any given transmission path may or may not be on the same PCB as a given pickup line for that transmission path. In addition, although FIG. 5 illustrates pickup lines 225 and 235 as both crossing the same set of transmission paths, this is not necessarily the case, and any pickup line may cross or not cross any given transmission path, depending upon design requirements. Overall therefore, the number and location of any pickup lines crossing any given transmission path will depend upon the desired sensitivity and granularity of fault location, as well as any other factors relating to overall system design (e.g. cost).

Figure 6:
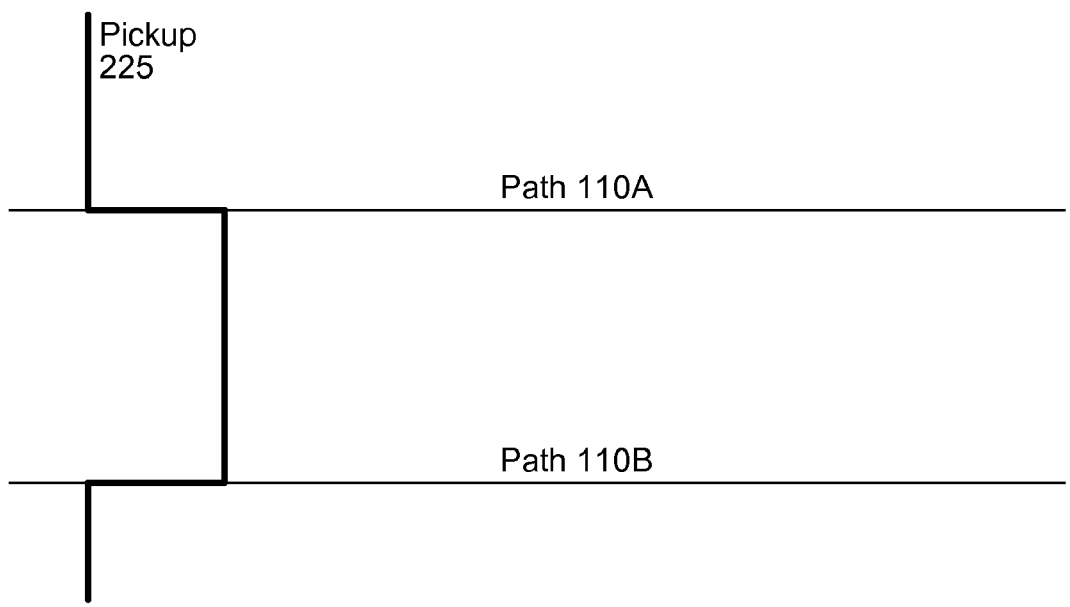
FIG. 6 illustrates the relative geometry between a transmission path and a pickup line in accordance with one embodiment of the invention.

In the embodiment of FIG. 2, pickup lines 225 and 235 cross transmission path 110 in a perpendicular direction. However, other embodiments may adopt different geometries. For example, FIG. 6 illustrates an implementation where pickup line 225 is configured to run for a short distance in parallel with transmission path 110A and also with transmission path 110B. It will be appreciated that such a parallel configuration increases the capacitive coupling between pickup line 225 and the transmission paths 110A and 110B. If there is a test signal on transmission path 110A and normal data operations on transmission path 110B (for example), then the greater increased coupling will lead to a stronger signal from transmission path 110A, but also to more noise from transmission path 110B. The increased coupling geometry of FIG. 6 is therefore especially useful to improve the signal-to-noise ratio of signal 227 for detection when a significant proportion of the noise on a pickup line does not arise from couplings to other transmission paths that are covered for test purposes by the pickup line. In this situation, the noise arises in the detection circuitry itself (e.g. if the signal level is very small), and/or from a more general noise environment that influences the pickup line (e.g. due to other PCBs in the vicinity). It will be appreciated that the level of capacitive coupling provided between a pickup line and the various transmission paths monitored by the pickup line may vary from one transmission path to another, depending on particular design considerations, expected signal levels and so on.

Figure 7:
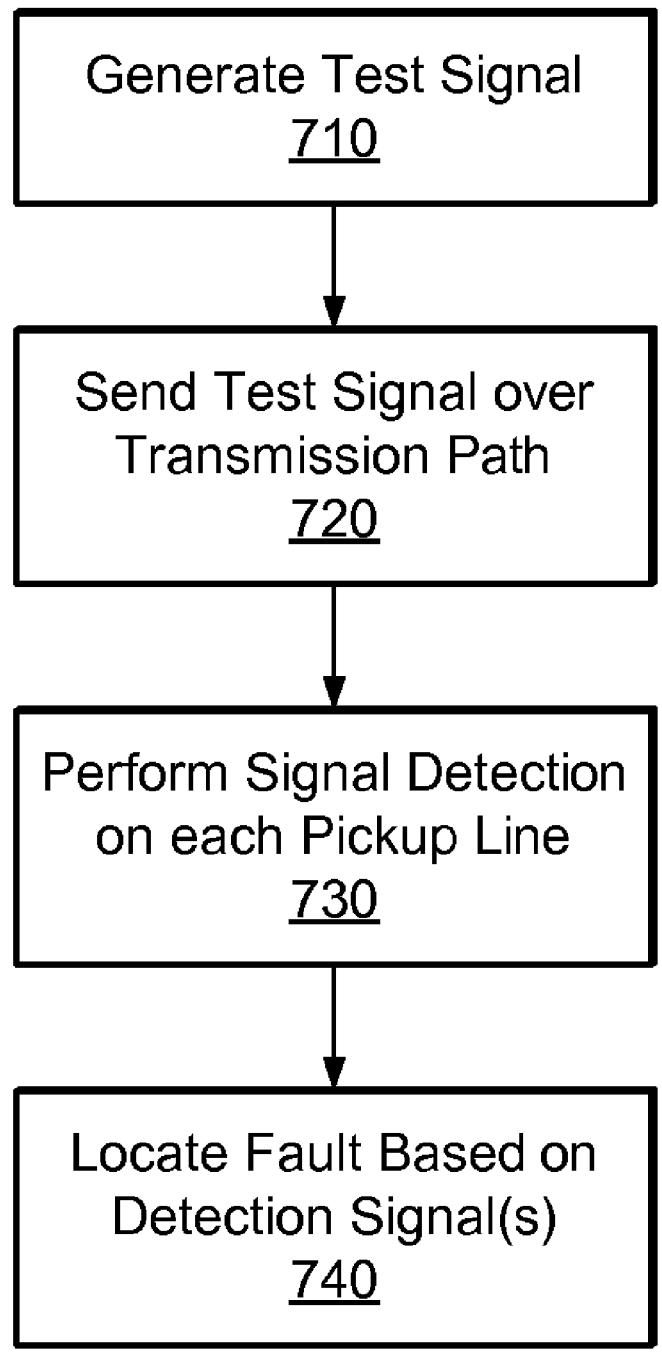
FIG. 7 is a flowchart of a method for testing a transmission path in accordance with one embodiment of the invention.

FIG. 7 presents a flowchart illustrating determining a fault location in accordance with one embodiment of the invention. Such fault location activity might perhaps be initiated after the detection of an error within receiver 122. The method commences with the generation of a test signal (710), which in one implementation is a low frequency square wave. The test signal is then transmitted over the transmission path that is to be investigated (720). One or more pickup lines are provided, each of which is capacitively coupled to the transmission path being investigated. The pickup lines are monitored for a signal corresponding to the test signal (730). The detection of such a signal can exploit knowledge of the form of the test signal injected onto the transmission path in order to enhance sensitivity. The presence or absence of a signal corresponding to the test signal on any given pickup line can then be used to locate a fault (if any) on the transmission path (740). In particular, if no signal is detected on a pickup line, then it can be assumed that the test signal that is being propagated on the transmission path has been interrupted by a fault on the transmission path that occurs prior to the intersection of the transmission path with the relevant pickup line.

The skilled person will be aware of various modifications on the approach described so far that could be adopted if appropriate. For example, the phase sensitive detector 315, and in particular switch 420, may have a facility to run at 90 degrees ($\pi/2$) out of phase from the reference signal 216 (and hence from the test signal 211). Thus for the half cycle of the test signal with a value of +1, the gain for the first half of this half cycle (i.e. the first quarter of a cycle) will be +1, and the gain for the second half of this half cycle (i.e. the second quarter of a cycle) will be −1. Consequently, the average signal over this half cycle will be zero. An analogous result will be obtained for the second half of the cycle when the test signal will have a value of −1). It will be appreciated that the rapid switching of the output every quarter of a cycle will be rejected by low pass filter 320, and as a result, comparator 325 will only receive the average signal value, namely zero.

The option to run the phase sensitive detector 315 at 90 degrees out of phase from the reference signal 216 provides a mechanism for verifying any positive signal detected by comparator 325. Thus if output 330 indicates a positive result regarding the detection of signal 227 for an "in-phase" setting of switch 420, then switch 420 can be altered to the 90 degree out-of-phase setting. If the positive signal 330 now disappears, this confirms the legitimacy of the original detection. However, if the positive signal 330 is maintained through this phase switch, this indicates that the initial result was somehow spurious, and does not represent a proper detection of the test signal on pickup line 225.

In another embodiment, the phase sensitive detector can be controlled so that the phase angle between the reference signal 216 and the signal on pickup line 225 is variable from 0 degrees to 90 degrees. Such variation may be achieved by introducing a delay into signal reference 216 using a suitable hardware or software function. As the delay increases, the output from low pass filter 320 falls from its maximum (in-phase) value to its zero (out-of-phase) value.

In such an embodiment, detector 221 can be calibrated by having a relatively low (fixed) value of Vref, so that the in-phase output from the low pass filter 320 is expected to exceed Vref. The phase difference between the signal on line 225 and the reference signal 216 is now increased, causing the output from low pass filter 320 to fall, until the output from low pass filter 320 drops below Vref, thereby causing comparator 325 to flip. The phase difference at which this transition in comparator 325 occurs can be maintained as a calibration setting for detector 221 (for example, stored in a EEPROM on FRU 111).

During subsequent test operations, the phase difference between the test signal and the reference signal 216 can be modified in a similar manner from 0 to 90 degrees (or vice versa) to measure the particular phase difference at which the output of comparator 325 transitions. If this measured phase difference is much smaller than the calibration setting (allowing for a suitable margin), or if the output from the low pass filter is already below Vref even for in-phase operation, then this is indicative that a fault has appeared within apparatus 200.

Note that in some implementations, phase adjustment of reference signal 216 may be more accurate than voltage adjustment of reference 326 (for example, the changes in voltage level may be more prone to temperature-induced fluctuation than the changes in phase). Accordingly, the use of variable phase to set the calibration level and then to detect the absence or modification of the signal on line 225 may lead to improved sensitivity and reliability.

In another embodiment, rather than using a periodic signal for test signal 211, a non-periodic signal could be used, for example a pseudo-random sequence. With this approach, phase sensitive detector 315 could still be used to detect the signal on pickup line 225, providing that the reference signal 216 used to drive the switch 420 still corresponded to the (pseudo-random) test signal. In such a situation, phase sensitive detector 315 can be considered as performing a cross correlation between the signal on pickup line 225 and the reference signal 216 in order to achieve high sensitivity detection of the test signal on pickup line 225.

It will be appreciated that the approach described here for detecting faults in circuits requires very little in the way of additional components and lines, and so can be implemented at low cost. In addition, the technique is non-invasive—it does not require modification of the circuit itself that is being tested, nor does it directly interfere with normal operations of the circuit. Accordingly a test facility such as described herein can be (retro)fitted to existing circuit designs, and also included with little or no difficulty in future circuit designs.

The test facility described herein can also be used in a noisy environment, such as is very typical of a running computer or other electronic system, by virtue of the sensitive signal detection techniques. Accordingly, the integrity of one particular transmission path in a system can be investigated without requiring that all other transmission paths in the system are temporarily suspended (which might have a major impact on user activities).

The approach described herein is also amenable to automated activation within a system, for example via a service processor or other system management facility, when it is detected that a transmission path has failed or is no longer operating correctly. Information obtained by the test facility relating to the location of a fault can then be used to determine an appropriate strategy for dealing with the fault. Such a strategy can cover both ongoing operation of the system, for example which portions (if any) of the system should be deconfigured in view of the fault, and future repair, such as which particular FRU should be replaced in order to remedy the fault.

In conclusion, a variety of particular embodiments have been described in detail herein, but it will be appreciated that this is by way of exemplification only. The skilled person will be aware of many further potential modifications and adaptations that fall within the scope of the claimed invention and its equivalents.

The invention claimed is:

1. A method for testing a transmission path across one or more printed circuit boards comprising:
   during operation of the one or more printed circuit boards:
      performing a normal data communication at a normal operating frequency from a first location on the transmission path to a second location on the transmission path;
      presenting a test signal at the first location on the transmission path, wherein the frequency of said test signal is lower than the normal operating frequency;
      providing a pickup line capacitively coupled at the second location to the transmission path; and
      monitoring the pickup line with a detector to determine whether or not the test signal is present, wherein if the test signal is not present, it is determined that there is a fault on the transmission path between the first location and the second location.

2. The method of claim 1, wherein said first location on the transmission path represents the output pin of a semiconductor device.

3. The method of claim 2, wherein said test signal is presented at the output pin using a JTAG interface of the semiconductor device.

4. The method of claim 1, wherein said test signal comprises a periodic signal having a substantially lower frequency than signals communicated over said transmission path during normal operation of the one or more printed circuit boards.

5. The method of claim 4, wherein said test signal comprises a square wave.

6. The method of claim 4, wherein said detector includes a phase sensitive detector.

7. The method of claim 6, wherein said detector further includes a low pass filter.

8. The method of claim 7, wherein said detector further includes a digital voltmeter to measure the output of the low pass filter.

9. The method of claim 6, wherein determining whether or not the test signal is present includes:
comparing the output of the phase sensitive detector against a reference voltage; and
varying the phase difference between the reference signal and the test signal to determine a phase difference at which the output of the phase sensitive detector matches the reference voltage.

10. The method of claim 1, further comprising performing a calibration on the transmission path, and storing information from the calibration in at least one of said one or more printed circuit boards, wherein said calibration information is used by the detector to determine whether or not the test signal is present.

11. The method of claim 10, wherein said calibration is performed by comparing a voltage on said pickup line when there is no fault on the transmission path with a reference voltage, wherein said reference voltage is varied to a plurality of different levels to find a reference voltage level that corresponds to the voltage on the pickup line.

12. The method of claim 10, wherein said calibration information is stored in a programmable read only memory (PROM).

13. The method of claim 1, wherein said pickup line is capacitively coupled to multiple transmission paths.

14. The method of claim 1, further comprising:
providing one or more additional pickup lines capacitively coupled at respective locations to the transmission path; and
monitoring each of the one or more additional pickup lines to determine whether or not the test signal is present on each additional pickup line, wherein whether or not the test signal is present on a particular pickup line is dependent upon a location of a fault on the transmission path.

15. The method of claim 14, wherein the transmission path spans a plurality of printed circuit boards, and said respective locations where each of the one or more additional pickup lines are capacitively coupled to the transmission path are distributed across at least two of said plurality of printed circuit boards.

16. The method of claim 15, wherein said plurality of printed circuit boards correspond to at least two field replaceable units.

17. Apparatus for testing a transmission path across one or more printed circuit boards comprising:
a facility for inserting a test signal at a first location on the transmission path, wherein the frequency of said test signal is lower than the frequency of normal data communications on said transmission path;
a plurality of pickup lines each capacitively coupled at respective locations to the transmission path, and
a plurality of detectors configured to:
monitor each of the plurality of pickup lines to determine whether or not the test signal is present on each of the plurality of pickup lines, wherein whether or not the test signal is present on a particular one of the plurality of pickup lines is dependent upon the location of a fault on the transmission line.

18. The apparatus of claim 17, wherein said first location on the transmission path represents the output pin of a semiconductor device.

19. The apparatus of claim 18, wherein said test signal is inserted at the output pin using a JTAG interface of the semiconductor device.

20. The apparatus of claim 17, wherein said test signal comprises a periodic signal having a substantially lower frequency than signals communicated over said transmission path during normal operation of the one or more printed circuit boards.

21. The apparatus of claim 20, wherein said test signal comprises a square wave.

22. The apparatus of claim 20, wherein said detector includes a phase sensitive detector.

23. The apparatus of claim 22, wherein said detector further includes a low pass filter.

24. The apparatus of claim 23, wherein said detector further includes a digital voltmeter to measure the output of the low pass filter.

25. The apparatus of claim 23, wherein determining whether or not the test signal is present includes comparing the output of the phase sensitive detector against a reference voltage, and varying the phase difference between the reference signal and the test signal to determine a phase difference at which the output of the phase sensitive detector matches the reference voltage.

26. The apparatus of claim 17, wherein a calibration is performed on the transmission path, and information from the calibration is stored in at least one of said one or more printed circuit boards for use by the detector to determine whether or not the test signal is present.

27. The apparatus of claim 26, wherein said calibration is performed by comparing a voltage on said pickup line when there is no fault on the transmission path with a reference voltage, wherein said reference voltage is varied to a plurality of different levels to find a reference voltage level that corresponds to the voltage on the pickup line.

28. The apparatus of claim 26, further comprising a programmable read only memory (PROM) for storing said calibration information.

29. The apparatus of claim 17, wherein at least one of the plurality of pickup lines is capacitively coupled to multiple transmission paths.

30. The apparatus of claim 17, wherein the transmission path spans a plurality of printed circuit boards, and said respective locations where each of the plurality of pickup lines is capacitively coupled to the transmission path are distributed across at least two of said plurality of printed circuit boards.

31. The apparatus of claim 30, wherein said plurality of printed circuit boards correspond to at least two field replaceable units.

32. A method, comprising:
inserting a test signal at a first location on a transmission path extending across one or more printed circuit boards, wherein a frequency of said test signal is lower than a frequency of normal data communications on said transmission path;
providing a plurality of pickup lines each capacitively coupled at respective locations to the transmission path;
monitoring each of the plurality of pickup lines to determine whether or not the test signal is present on each of the plurality of pickup lines; and
determining a location of a fault on the transmission line dependent upon whether or not the test signal is present on each of the plurality of pickup lines.

* * * * *